United States Patent [19]

Liang et al.

[11] Patent Number: 5,212,044
[45] Date of Patent: May 18, 1993

[54] PHOTORESIST COMPOSITION INCLUDING POLYPHENOL AND SENSITIZER

[75] Inventors: Rong-Chang Liang, Centerville; Alexander R. Pokora, Pickerington; William L. Cyrus, Jr., Ray, all of Ohio

[73] Assignee: The Mead Corporation, Dayton, Ohio

[21] Appl. No.: 793,260

[22] Filed: Nov. 13, 1991

Related U.S. Application Data

[63] Continuation of Ser. No. 241,657, Sep. 8, 1988, abandoned.

[51] Int. Cl.$^5$ .......................... G03F 7/023; G03F 7/32
[52] U.S. Cl. .................................... 430/192; 430/165; 430/191; 430/193; 430/270; 430/326; 430/138
[58] Field of Search ............... 430/270, 192, 165, 271, 430/272, 138, 151

[56] References Cited

U.S. PATENT DOCUMENTS

| | | | |
|---|---|---|---|
| 3,929,488 | 12/1975 | Smith | 430/191 |
| 4,296,194 | 10/1981 | Harper et al. | 430/191 |
| 4,529,682 | 7/1985 | Toukhy | 430/192 |
| 4,624,909 | 11/1986 | Saotome et al. | 430/190 |
| 4,647,952 | 3/1987 | Pokora et al. | 503/210 |
| 4,760,048 | 7/1988 | Kurihara et al. | 430/151 |

FOREIGN PATENT DOCUMENTS 2154330 9/1985 United Kingdom ................ 430/189

*Primary Examiner*—Charles L. Bowers, Jr.
*Assistant Examiner*—John S. Chu
*Attorney, Agent, or Firm*—Thompson, Hine and Flory

[57] ABSTRACT

A photoresist composition, and a process for using the same are; the composition comprises a polyphenolic resin and a sensitizer effective, when exposed to actinic radiation, to provide alkali solubility to said composition, wherein said resin is represented by the formula (I) or (II):

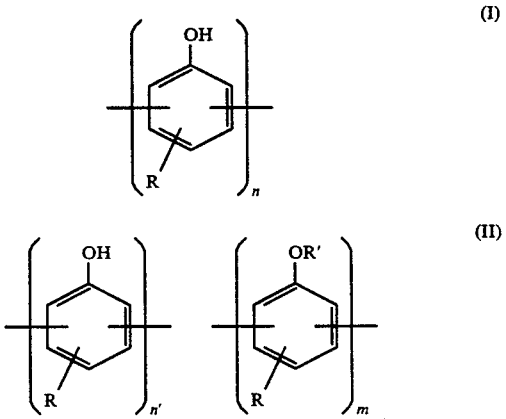

wherein R is a hydrogen atom, a halogen atom, an alkyl group, an alkoxy group, an alkaryl group or an aryl group; R' is a silyl group; and n and n'+m are greater than 3. The composition exhibits high thermal and plasmal resistance and good dissolution characteristics.

20 Claims, No Drawings

5,212,044

PHOTORESIST COMPOSITION INCLUDING POLYPHENOL AND SENSITIZER

This is a continuation of co-pending application Ser. No. 07/241,657, filed Sep. 8, 1988, now abandoned.

BACKGROUND OF THE INVENTION

1. Field of the Invention

The present invention relates to a positive working photoresist composition, and more particularly to a photoresist composition containing a polyphenol and a sensitizer.

2. Description of the Prior Art

Photoresist compositions are facing new challenges in the fabrication of microelectronic components. The need to mass-produce submicron circuits has resulted in a demand for resists with the properties of high resolution, high thermal resistance, high plasma resistance and optimal dissolution characteristics.

When producing a microelectronic component such as a microchip, the amount of information which can be placed on the chip is a direct function of the resolution available with the photoresist. As the resolution of the photoresist increases, higher storage capacities are attainable in the microelectronic component. Accordingly, there is an ongoing effort in the industry to produce photoresists which are capable of higher resolution.

Positive-working photoresist materials evolved from discoveries made by the Kalle Corporation which developed the first positive-acting photoresist based on the use of a novolak matrix resin and a diazoquinone photo-active compound or sensitizer which retards dissolution of the novolak. To produce the Kalle photoresist, the sensitizer and novolak resin are dissolved in an organic solvent and the resultant solution is coated onto a substrate such as a silicon wafer using methods known in the art such as spin coating. The coating solvent is then removed from the resist composition to produce a film on the substrate in which the sensitizer is uniformly distributed throughout the novolak matrix. Upon exposure of the photoresist composition to radiation, the sensitizer is converted into a base-soluble, acidic photoproduct that does not retard dissolution of the novolak in the exposed regions. After exposure, the photoresist is selectively dissolved in an aqueous base to remove the areas of the photoresist which were subject to the image-wise exposure. Images produced from positive-working resists are extremely accurate, require minimal processing techniques and involve few processing steps. Examples of such positive-working photoresist compositions are disclosed in UK Patent No. 784,672; U.S. Pat. No. 3,402,044; U.S. Pat. No. 4,365,019 and U.S. Pat. No. 4,684,599. The resins most often used with positive-resist sensitizers are the phenol formaldehyde novolak and its derivatives and poly(p-vinylphenols).

Positive-working photoresist compositions as described above are used in the semiconductor chip industry. After removing the exposed portions of the resist pattern, the underlying substrate is etched. Dry etching or plasma etching techniques are now commonly used to achieve the submicron resolution that is required to produce microchips having storage capacity which approaches and exceeds one megabyte. Resins having sufficiently high thermal stability and plasma resistance to be used with these high resolution techniques are therefore required.

Two plasma etching or resist removal techniques have been used in the microchip industry. In the single layer resist technique, a single layer of a photoresist is applied to the surface of a silicon chip. The resist is exposed and then developed with an alkaline solution to remove the exposed portions of the resist. The substrate is then plasma etched using a $CF_4$ plasma. The areas of the substrate which are not protected by the resist are removed. In a second process, known as the multilayer resist process, a photoresist containing silicon is coated over a layer of a second resist material on a substrate. The second resist may be photosensitive or non-photosensitive. The silicon-containing resist is exposed and developed with an alkaline developer solution to uncover areas of the underlying resist. The multilayer resist is then subjected to an oxygen plasma which converts the silicon present in the upper resist to silicon dioxide and removes the uncovered areas of the underlying resist.

Attempts have been made to improve the thermal stability and plasma resistance of novolak resists. Following development resists have been heated to above their cross-linking temperature to produce a thermally stable structure. However, the cross-linking temperature of novolak resists is much higher than the glass transition temperature of the resists, creating a thermally stable resist profile only after severe reflow.

Other well-known hardening techniques consist of cross-linking the novolak resin resist by irradiation with deep UV light or by subjecting the image resist to a noneroding plasma. These techniques harden the resist image only at the surface because of limited penetration of the cross-linking action. Surface hardening works well with small features With larger features, the skin is not sufficiently rigid to hold the bulk of the resist which deforms at temperatures above the glass transition temperature. Hardening by electron beam or ion beam bombardment can crosslink the resist in the bulk but there is a possibility of radiation damage of the semiconductor devices on the wafer as well as high equipment costs.

Further refinements include progressive heating of the resist image while it undergoes skin hardening, but extremely sophisticated microprocessor control must be implemented and the process must be reoptimized frequently.

It is also known in the art to overcoat the novolak resin with polymethyl methacrylate. Although this improves resolution, the production of the resist involves increased production steps and increased cost. Moreover, the overcoating introduces an additional possibility of error into the photoresist composition.

Accordingly, there exists a need in the art for a simple positive-working photoresist composition which is capable of submicron resolution and can be produced in a minimum number of steps.

SUMMARY OF THE INVENTION

In accordance with the present invention, a novel positive-working photoresist composition comprises a methylene bridge-free polyphenol and a sensitizer. By comparison to prior art photoresist compositions containing a phenol-formaldehyde novolak resin, the inventive photoresist composition is able to provide higher resolution. The improved resolution is accomplished as a result of the photoresist composition having improved thermal and plasma resistance and improved dissolution characteristics in basic developers.

In accordance with one embodiment of the present invention, the inventive positive-working composition comprises a polyphenol and a sensitizer. When exposed to actinic radiation, the sensitizer is converted to a product which provides alkaline solubility to the composition. The polyphenol is represented by the formula (I) or (II):

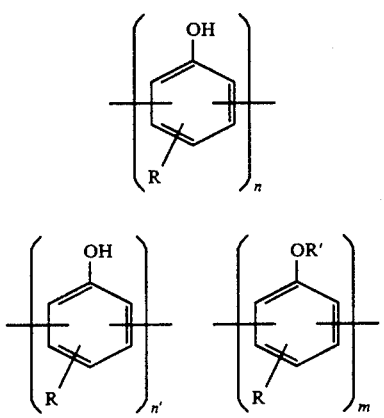

wherein R is a hydrogen atom, a halogen atom, an alkyl group, an alkoxy group, an alkaryl group, an aryl group or a silyl group, and within a polyphenol, the R groups may be the same or different; R' is a silyl group; and n and n'+m are greater than 3 and preferably greater than 4. The polymer represented by formulas (I) and (II) is preferably a simple statistical copolymer.

The inventive photoresist composition is believed to be superior to prior photoresists based on novolak resins because of the absence of the methylene linkage in the phenolic resin. As a result, the inventive photoresist composition has a high thermal and plasma resistance and improved dissolution characteristics as compared to resists prepared from novolak resins. Polyphenols in accordance with formula (I) in which at least a portion of the R substituents are silyl groups and polyphenols in accordance with formula (II) in which m is greater than 0 are particularly useful in the multilayer resist process.

In another embodiment of the present invention, the positive-working composition comprises the above-defined resin and sensitizer, and the resin is further characterized in that it is prepared by reacting a phenol with a peroxidase enzyme in the presence of a peroxide or an oxidase enzyme in the presence of oxygen in an organic solvent containing medium. The inventive compositions employing polyphenols produced by the above enzymatic process are advantageous over prior art photoresist compositions containing novolak resins for an additional reason. Novolak resins are generally prepared using a metal catalyst (although sulfuric acid is also used it does not provide good control over molecular weight) To use these novolak resins as part of a photoresist composition, it is necessary that the catalytic amount of metal ions be removed from the resin. This is particularly so in the case where the photoresist composition is coated onto a silicon wafer for use in making a silicon chip. While the enzymes used in preparing the resins used in the present invention contain a metal such as iron, they are readily removed by extracting a solution of the resin in a solvent with water. This results in an increase in efficiency and reduces the costs of materials used to produce metal-free photoresists.

In yet another embodiment of the present invention, an element is provided which is useful in manufacturing a microelectronic component comprising a substrate having a coating of the positive-working photoresist composition defined above on one surface.

The present invention also provides a process for forming a resist image which comprises applying a photoresist composition including the aforementioned polyphenolic resin and a sensitizer to a substrate, and imagewise exposing the composition to actinic radiation.

Another manifestation of the present invention is polyphenols of the formula (I) or (II) which are single-substituted as described herein.

While the compositions of the present invention are particularly useful in the preparation of microelectronic components, those skilled in the art will recognize that they are equally useful in other applications in which resists containing novolak resins have previously been used such as in making printing plates, printed circuits, etc..

Accordingly, it is an object of the present invention to provide a positive-working photosensitive composition having improved thermal and plasma resistance, improved dissolution characteristics, and improved image resolution.

Other objects and advantages of the present invention will become apparent from the following description and the appended claims.

DETAILED DESCRIPTION OF THE PREFERRED EMBODIMENTS

While describing the preferred embodiments, specific terminology will be utilized for the sake of clarity. It is to be understood that such terminology includes not only the cited embodiments, but all technical equivalents which perform substantially the same function in substantially the same way to obtain the same result.

The inventive composition comprises a polyphenolic resin and a sensitizer. The composition is preferably used as a photoresist composition and is capable of becoming alkaline soluble upon exposure to actinic radiation. The polymer resin portion of the composition is more preferably a phenolic resin as is set forth in either Formula IA or Formula IIA:

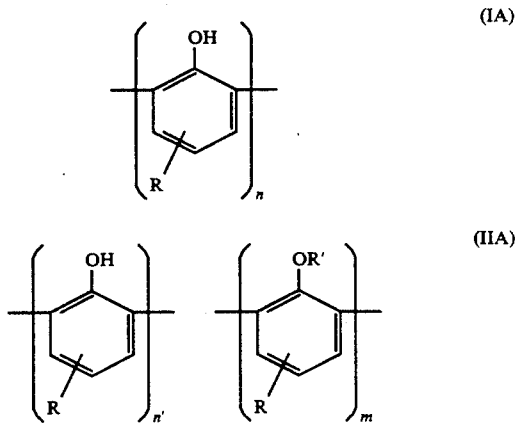

wherein R is a hydrogen atom, a halogen atom, an alkyl group, an alkoxy group, an alkaryl group, an aryl group or a silyl group; R' is a silyl group; and n and n'+m are greater than 3 and preferably greater than 4.

For applications which do not require high plasma resistance, R may represent an alkyl group, an alkoxy group or a halogen atom. Representative examples of alkyl groups and alkoxy groups may contain up to 10 carbon atoms such as t-butyl, n-butyl, octyl, nonyl, methoxy, ethoxy, etc. Representative halogen atoms are chlorine, bromine and iodine.

For high plasma resistance R is preferably an aromatic group or a silyl group. When R is an aromatic group such as an aryl group, it is typically an alkylphenyl group or a phenyl group in which the phenyl ring may be substituted. Examples of alkaryl groups represented by R include benzyl, α-methylbenzyl, and αα-dimethylbenzyl. Alkaryl groups represented by R may be substituted by a hydroxy group, preferably a p-hydroxy group; a trimethyl silyl group; a trimethylsilyloxy group or any of the silyl groups defined below. Again for high plasma resistance alkyl substitution and halogen substitution should be avoided although they may be useful in other applications.

Examples of preferred substituted phenyl groups are hydroxy (especially 4'hydroxy) phenyl, methoxy substituted phenyl, trimethylsilyl substituted phenyl and trimethylsiloxy substituted phenyl, or phenyl substituted by any of the silyl groups defined next. Examples of silyl groups represented by R or R' which increase plasma resistance significantly are —SiR$_3$"—, —SiR$_2$"OSiR$_3$"—where R" is a lower alkyl group (e.g., 1–4 carbon atoms) and preferably a methyl group.

It is generally accepted that more than 10% by atomic wt. and typically about 15% silicon must be introduced into conventional novolac resins to achieve acceptable plasma resistance for use in the multilayer resist process. The more silicon content, the better plasma resistance but the poorer the solubility of the novolac in alkaline solution. The use of the methylene bridge free phenolic resin in the present invention allows one to use less silicon content to achieve acceptable plasma resistance thereby making it easier to retain the requisite alkaline dissolution characteristics.

The polyphenolic resins used in the present invention are preferably trimers and still more preferably pentamers or higher resins. For high thermal and plasma resistance and optimal dissolution characteristics, n and n,+m in formulas (I) and (II) are preferably greater than 3 and still more preferably about 4 to 8. Generally the polyphenols may range in molecular weight from about 600 to 5,000 and more commonly from about 800 to 1,800. They are preferably also characterized by a glass transition temperature (Tg) greater than about 120° C. and preferably about 140° C.±20° C.

The phenolic resin is prepared by polymerization of a phenol starting material Specific examples of phenols which can be polymerized include phenol, 2-chlorophenol, 2-methylphenol, 3-methylphenol, 4-t-butylphenol, 4-n-butylphenol, 4-ethylphenol, cresol, p-phenylphenol, p-octylphenol, p-nonylphenol, p-hyroxybenzoic acid, 4-hydroxynaphthoic acid, p,p,-biphenol, 4-aminosalicylic acid, salicylic acid, methyl salicylate, ethyl salicylate, 4,4'-isopropylidenediphenol (Bisphenol A), ethyl 4-hydroxybenzoate, methoxyphenol, p-trimethysilylphenol, etc. For plasma resistance, the following phenols are preferred: p-trimethylsilyl phenol, 4-hydroxy-4'-trimethylsiloxyl-2,2-diphenylpropane, and 1-hydroxy-4-trimethylsilyl benzene.

Phenols useful in preparing the photoresists of the present invention are commercially available or easily synthesized using known phenolic substitution reactions.

The phenol starting material is reacted with a peroxidase enzyme in the presence of a peroxide or an oxidase enzyme in the presence of oxygen in an organic solvent medium to generate phenolic radicals which react to form the phenolic resin.

This procedure provides a mixture of compounds ranging from 2 and higher in polymerization degree. The preferred compounds as defined above can be separated by solvent precipitation in acetone-water mixtures.

Peroxidase and oxidase enzymes are known in the art and are commercially available. The most typical example of a peroxidase enzyme useful in the present invention is horseradish peroxidase, but other peroxidases such as chloroperoxidase (and other haloperoxidases), lactoperoxidase, bacterial peroxidases and ligninases are also useful. In addition, oxidase enzymes such as fungal laccase and tyrosinase may be useful.

The amount of the enzyme used to make the phenolic resin will depend on its activity. The enzyme functions as a catalyst and is not consumed in the reaction. For commercially available enzymes, the enzyme can be reacted in an amount of about 10 milligrams to 5 grams per 100 grams phenol.

In accordance with the preferred embodiment of the invention, the enzyme is dissolved in water and added to a solution of the phenol. The enzyme solution concentration is not particularly critical. It is generally desirable to prepare an enzyme solution at a concentration such that it can be added in an approximately equal volume to the solution of the phenol, but this may vary. The enzyme can also be reacted on a carrier if desired.

The oxidizing agent used in generating the free radicals is typically hydrogen peroxide, but other peroxides are useful. Examples of other potentially useful peroxides include methyl peroxide, ethyl peroxide, etc.

The peroxide is reacted in an amount of about 0.1 to 2.5 moles per 100 grams phenol and, more typically, about 0.1 to 1.0 moles per 100 grams phenol. Depending upon the nature of the oxidizing agent, it is reacted neat or as a solution. The preferred oxidizing agent, hydrogen peroxide, is dissolved in water. Its concentration may range from about 0.01 to 1.0 mol per liter.

The phenol can be dissolved in a water-miscible or a water-immiscible solvent. Representative examples of useful water-immiscible solvents include hexane, trichloroethane, methyl ethyl ketone, ethyl acetate, and butanol. Examples of useful water-miscible solvents include ethanol, methanol, dioxane, tetrahydrofuran (THF), dimethyl formamide, and acetone. The reaction is typically carried out at phenol concentrations of about 1 to 100 g per 100 ml solvent.

As indicated above, a number of different procedures may be used to react the phenol. Solutions of the phenol, enzyme, and peroxide may be individually prepared and metered into a reaction vessel, or solutions of the phenol and enzyme may be pre-mixed and the peroxide gradually added thereto. In a particularly preferred reaction, a dispersion of the phenol solution in an aqueous solution of enzyme is prepared and the reaction occurs near the oil-water interface. Alternatively, the enzyme and phenol may be dissolved in a common solvent and the peroxide added. Those skilled in the art will appreciate that a number of reaction/mixing sequences are useful provided that the peroxide is added at a controlled rate which is approximately equal to the rate at which it is consumed such that the concentration of the peroxide does not build to a level at which it undesirably inhibits the reaction.

The organic-aqueous system formed upon mixing the phenol, enzyme and peroxide may contain water and an organic solvent in a volumetric ratio (water:organic) in the range of about 1:100 to 100:1, more typically, 1:2 to 2:1, and most typically, about 1:1. The most preferred ratio will vary with the nature of the phenolic monomer(s) that is(are) polymerized.

The reaction of the phenol proceeds at room temperature, but temperatures of about 0° to 50° C. can be used. The enzymes are temperature sensitive and can lose their activity if the reaction temperature becomes to high. For example, temperatures in excess of about 60° C. render horseradish peroxidase inactive However, some latitude exists, depending upon the solvent system which is used. Certain solvents can stabilize the enzyme and thereby permit the use of higher temperatures. There is evidence in the literature that temperatures up to 100° C. may be useful if the enzyme is immobilized or if appropriate solvent systems are used. See, for example, Zaks and Klibanov, "Enzymatic Catalysis in Organic Media at 100° C.," Science, Vol. 224, pp. 1249–1251, Jun. 15, 1984.

The activity of the enzyme is pH dependent. The reaction is preferably carried out at a pH in the range of 4 to 12 and, more preferably, 4 to 9. Buffers can be used to maintain pH, but are not usually required. One example of a useful buffer is a potassium phosphate buffer. A pH is selected at which the enzyme is highly active. This will vary with the nature of the enzyme and its source. For Sigma Type I peroxidase (a product of Sigma Chemical Company) The most preferred pH is about 4.0 to 6.0. Using this enzyme, deionized water can be used to form the solvent system.

While reference is herein made to the bulk pH of the reaction system, those skilled in the art will appreciate that it is the pH in the micro-environment of the enzyme that is critical. Thus, where the phenol is dissolved in a water immiscible solvent and the enzyme solution is dispersed in the solution of the phenol, it is the pH of the enzyme solution which is critical.

The phenolic resins are soluble in common organic solvents and can be coated from solution to form isotopic glassy films of high quality. The polymers are also soluble in aqueous base solutions by virtue of the acidic character of their phenolic functionality.

The inventive positive-working resist composition includes a sensitizer which functions as a dissolution inhibitor for aqueous base development of the phenolic resin. Exposure of the resin and sensitizer to light results in conversion of the inhibitor into a base-soluble, acidic photoproduct that does not inhibit dissolution rate of the phenolic resin in the regions where exposure has occurred. This photochemically generated difference in dissolution rate in aqueous base is exploited in the generation of relief images.

A number of sensitizers which are known in the art may be utilized in the present invention; the primary determination for selecting a sensitizer being the spectral characteristics of the radiation source selected. A large number of the sensitizers useful include the "diazoquinones" or "orthoquinone diazides" such as those disclosed in U.K. Patent No. 711,626, U.K. Patent No. 784,672, U.S. Pat. No. 3,402,044 and in Introduction to Microlithogaphy, (1983) and, Photoresist: Materials and Processes, pp. 48–55 (1975). These sensitizers are characterized by their sensitivity to ultra-violet light. Naphthoquinone diazides are also particularly useful.

Another class of sensitizers which may be used to form the inventive positive-working composition are quinone sensitizers, such as those disclosed in U.S. Pat. No. 4,684,599. These sensitizers are sensitive to ultraviolet and electron beam radiation. Another class of sensitizers which may be used in the inventive composition and which are sensitive to electron beam and deep UV are radiolabile poly(olefin sulfones), such as the polybutylene sulfones ($\overline{Mn}$=74,000), /developed by Bell Laboratories. Polymethyl methacrylate (e.g., $\overline{MW}$=30,000) may also be used as sensitizers for electron beam and deep UV radiation.

In the preferred embodiment of the present invention, the amount of phenolic resin to sensitizers ranges from 90:10 to 60:40, preferably between 85:15 to 75:25.

To form a microelectronic component, the resist composition of the invention is applied to the front surface of a suitable support and contact or projection-exposed image-wise to activating radiation such as light or E-beam radiation. The "images" that are useful include conventional microimages, such as those useful in forming integrated circuits. Useful supports include sheets and foils of such metals as aluminum, copper, magnesium, zinc, etc.; alloys such as Ga As; glass and glass coated with metals such as chromium, chromium alloys, steel, silver, gold platinum etc.; synthetic polymeric materials such as poly(alkyl methacrylates), e.g., poly(methylmethacrylate), polyester film base, e.g., poly(ethyleneterephthalate), poly(vinyl acetals), polyamides, e.g., nylon, cellulose ester film base, e.g., cellulose nitrate, cellulose acetate, cellulose acetate propionate and cellulose acetate butyrate. In the multilayer resist process, a planarizing layer is provided between the substrate surface and the photoresist.

For the manufacture of integrated circuit devices, silicon or silicon dioxide wafers, Ga As, as well as silicon nitrile and chromium-coated glass plate supports, are particularly useful. In the multilayer resist process, a planarizing layer is provided between the substrate surface and the photoresist.

For use as a printing plate conventional supports for such plates may be used such as aluminum and anodized aluminum. Depending upon the support selected, adhesion aids are optionally applied first as a sub-coating.

Any conventional method can be used to apply the composition to the support. The preferred method is as a coating using an appropriate solvent. Useful coating techniques include spin coating, whirler-coating, spray coating, curtain coating, and roll coating. Spin coating is particularly preferred.

The solvent used to prepare the resist composition for coating can be selected from any conventional coating solvent. Useful solvent include alcohols, esters, ethers, and ketones and particularly ethanol, 2-ethoxyethyl acetate, n-butyl acetate, 4-butyrolactone, diglyme, and mixtures thereof.

Preferred final thicknesses of the coatings vary, depending upon the final use and the etchants that are to be used, if any. Examples of preferred thicknesses range from between about 0.1 to about 20 microns. A thickness of about 1 to 3 microns is particularly preferred. After coating, the support is baked to remove the coating solvent, thus leaving a coating on the support comprising sensitizers uniformly distributed throughout the phenolic resin.

The equipment used to expose the resist coating is conventional. Depending on the sensitizer selected, the exposure source is selected to have a spectral sensitivity corresponding to the sensitivity of the sensitizer. Typical spectral exposures range between about 200 and 450 nm, with a preferred range being between about 360 and 405 nm.

Following exposure, the imaging composition is developed with an appropriate alkaline developer. Useful developers include conventional, positive-working developers. For example, those containing sodium hydroxide or phosphate, and those described in U.S. Pat. No. 4,141,733 and European Patent No. 23,758, e.g., quaternary alkanol ammonium hydroxides containing a sulfite stabilizer are particularly useful.

When using a wet developing technique, it is generally desirable to add a wet adhesion promoter to the phenolic resin as is known in the art. A particularly preferred promoter is hexamethyldisilazane. The promoter can be added to the resist formulation or applied separately as a primer layer.

Following development, conventional wet or dry etching processes are useful to etch away the support in the areas left unprotected by the development step.

The resist coating may also contain plasticizers compatible with the resin and the sensitizer such as dioctyl phthalate, dibutyl phthalate, or mineral oil but the inclusion of plasticizers is optional. Dyestuffs can also be included in the coating layer in order to make the coating and the developed image more visible. In addition, the coating may contain stabilizers which are typically reducing agents or antioxidants, such as thiourea, sugar and related compounds. Organic acids may also be used as stabilizers.

By utilizing the above composition as a resist coating, the resist has superior plasma and thermal resistance and dissolution characteristic as compared to prior art compounds utilizing novolak resins. The improved resistance and dissolution characteristic allows very high resolutions to be achieved. Typical resolutions achieved are in the sub-micron range. When used as part of information storage device, such as a silicon computer chip, the high resolution associated with the resist enables a greater amount of information to be stored.

It is hypothesized that the plasma and thermal resistance are improved as a result of the use of the methylene-free phenolic resin instead of the use of a novolak resin. It has been observed in the photoresist industry that a higher aromatic ratio provides a high resistance to plasma etching. The inventive compositions have a higher aromatic ratio than prior art compositions containing novolak resins because of the absence of linking through a methylene bridge. Similarly, because of the lack of methylene bridge linkages in the present compositions, heat distortion temperature is increased. In addition, the photoresist compositions possess greater processing speeds and higher contrast than prior art photoresist compositions.

Even higher plasma resistance can be obtained when some of the R and R' groups are silyl groups. In fact, the lack of methylene bridge in the resin allows one to use less silicone content to achieve the required plasma resistance in the multilayer resist process.

In addition to superior resolution, the inventive composition is much less expensive to produce than prior art compounds containing novolak resins. The production of prior art novolak resins in general relies upon the use of metal ion catalysts. The metal ion catalyst is incompatible with the preparation of microelectronic components, such as microchips, and as a result, the metal ion must be completely removed from the novolak resin to render it suitable for use. As a result, the cost of the resin is increased as a result of the purification steps required to remove the metal ions. By comparison, in the inventive composition, catalysis is accomplished by using a peroxidase or oxidase enzyme catalyst which is readily removed by extraction.

Having described the invention in detail and by reference to the preferred embodiments thereof, it will be apparent that modifications and variations are possible without departing from the scope of the appended claims.

What is claimed is:

1. A photoresist composition consisting essentially of a methylene bridge-free phenolic resin and a sensitizer, said sensitizer being present in an amount effective to render said composition alkaline soluble in areas exposed to actinic radiation, said phenolic resin being represented by the formula (I) or (II):

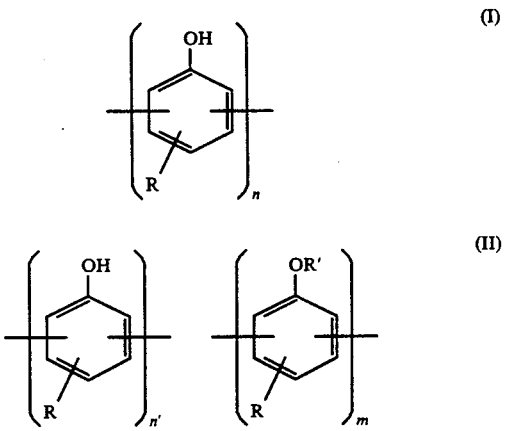

wherein R is a hydrogen atom, a halogen atom, an alkyl group, an alkoxy group, an alkaryl group, an aryl group or a silyl group; R' is a silyl group; and n and n'+m are greater than 3.

2. The composition according to claim 1 wherein the ratio of said resin to said sensitizer is about 60:40 to 90:10.

3. The composition according to claim 2 wherein R is selected from the group consisting of a hydroxy substituted phenyl group, a p-hydroxy-α, α-dimethylbenzyl group, a trialkylsilylphenyl group, a trialkylsiloxyphenyl group, and a trialkylsilyl group.

4. The composition according to claim 3 wherein the molecular weight of said resin is about 600 to 5,000.

5. The composition according to claim 4 wherein said sensitizer is a diazoquinone or a naphthoquinone diazide sensitizer.

6. The composition according to claim 4 wherein said phenolic resin is represented by the formula (IA) or (IIA):

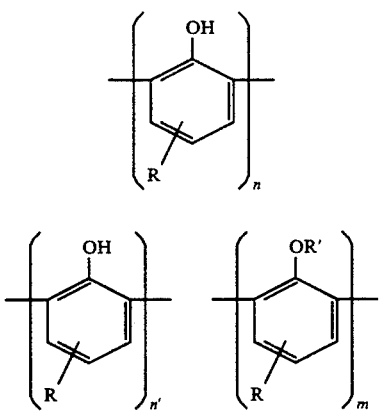

where R, R', n, n' and m are defined as in formulas (I) and (II).

7. The composition according to claim 1 wherein said sensitizer is a poly (butylene sulfone) or a polymethyl methacrylate.

8. A positive-working photoresist composition comprising a phenolic resin and a sensitizer, said sensitizer being present in an amount effective to render said composition alkaline soluble when exposed to actinic radiation and said resin being represented by the formula (I) or (II):

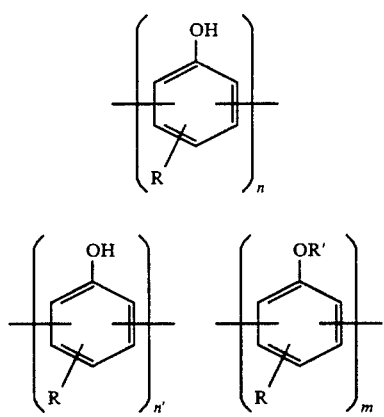

wherein R is a hydrogen atom, a halogen atom, an alkyl group, an alkoxy group, an alkaryl group, an aryl group or a silyl group; R' is a silyl group; and n and n'+m are greater than 3, said resin being prepared by reacting a phenol with a peroxidase enzyme in the presence of a peroxide or with an oxidase enzyme in the presence of oxygen in an organic solvent-containing medium.

9. The composition according to claim 8 wherein said enzyme is selected from the group consisting of horseradish peroxidase, chloroperoxidase, lactoperoxidase, bacterial peroxidases, ligninases, fungal laccase and tyrosinase.

10. The composition according to claim 9 wherein said reacting step occurs in the presence of a peroxide and wherein said peroxide is selected from the group consisting of hydrogen peroxide, methyl peroxide, ethyl peroxide and other higher alkyl peroxides.

11. The composition according to claim 8 wherein said organic solvent-containing medium is selected from the group consisting of hexane, trichloroethane, methyl ethyl ketone, ethyl acetate, butanol, ethanol, methanol, dioxane, tetrahydrofuran, dimethyl formamide and acetone.

12. The composition of claim 8 wherein said sensitizer is a poly (butylene sulfone) or a polymethyl methacrylate.

13. A material useful in producing a microelectronic component comprising:
a substrate having front and back surfaces, said front surface having a coating thereon, said coating comprising a photoresist composition, said photoresist composition comprising a phenolic resin and a sensitizer effective, when exposed to actinic radiation, to provide alkaline solubility to said composition,
wherein said phenolic resin is represented by the formula (I) or (II):

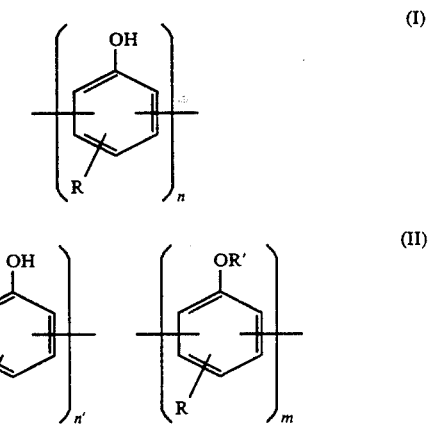

14. The material according to claim 13 wherein said substrate is made of a material selected from the group consisting of aluminum, copper, magnesium, zinc, GaAs, glass, metal coated glass, poly(alkyl methacrylates), polyesters, poly(vinyl acetals), polyamides, cellulose esters, silicon, silicon dioxide and silicon nitride.

15. The material according to claim 13 wherein said substrate is a silicon wafer.

16. The material according to claim 13 wherein said polyphenol is represented by the formulas (IA) and (IIA):

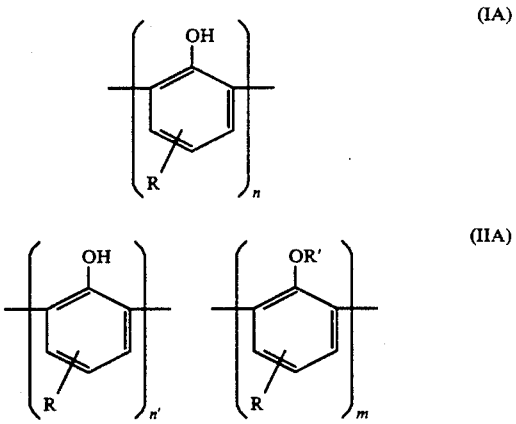

wherein R, R', n, n' and m are defined in formulas (I) and (II).

17. The material according to claim 16 wherein said component is useful in preparing a semiconductor chip.

18. The material according to claim 17 wherein the thickness of said coating is between about 0.1 and 20 microns.

19. The material according to claim 18 wherein the thickness of said coating is between about 1 and 3 microns.

20. The material according to claim 13 wherein a planarizing layer is interposed between said substrate and said photoresist composition.

* * * * *